US011784857B1

(12) United States Patent
Delshadpour et al.

(10) Patent No.: US 11,784,857 B1
(45) Date of Patent: Oct. 10, 2023

(54) ADAPTIVE LINEAR DRIVERS

(71) Applicant: NXP USA, Inc., Austin, TX (US)

(72) Inventors: Siamak Delshadpour, Phoenix, AZ (US); Peng Yan, College Station, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/723,043

(22) Filed: Apr. 18, 2022

(51) Int. Cl.
    *H04L 25/03* (2006.01)
(52) U.S. Cl.
    CPC .............. *H04L 25/03885* (2013.01)
(58) Field of Classification Search
    CPC ........... H04L 25/0292; H04L 25/03006; H04L 25/03019; H04L 25/03038; H04L 25/03254; H04L 25/0377; H04L 25/03885; H03G 3/3036; H03G 3/3089
    USPC ........ 375/229, 231, 232, 348, 350; 708/322, 708/323
    See application file for complete search history.

(56) References Cited

U.S. PATENT DOCUMENTS

| 6,819,166 | B1 | 11/2004 | Choi et al. |
| 9,088,258 | B2 | 7/2015 | Ichitsubo et al. |
| 10,367,666 | B2 * | 7/2019 | Zhang ..................... H04B 1/06 |
| 10,432,432 | B1 | 10/2019 | Liu et al. |
| 10,594,285 | B1 | 3/2020 | Delshadpour et al. |
| 11,206,161 | B1 | 12/2021 | Delshadpour et al. |
| 2011/0317751 | A1 | 12/2011 | Roethig et al. |
| 2018/0342997 | A1 * | 11/2018 | Maeda ....................... H03F 3/04 |
| 2022/0085779 | A1 * | 3/2022 | Yamamoto .......... H03F 3/45475 |
| 2022/0200605 | A1 * | 6/2022 | Jang ..................... H04L 25/0292 |

OTHER PUBLICATIONS

Beyene WT and al: "Statistical simulation of high-speed links with transmitter and receiver nonlinearities," 2014 IEEE 23rd Conference on Electrical Performance of Electronic Packaging and Systems, 2014, pp. 35-38.
Kyounghoon Yang et al.: "Automatic control of efficiency and linearity in power amplifiers for low-power wireless communications," 1998 Topical Meeting on Silicon Monolithic Integrated Circuits in RF Systems. Digest of Papers (Cat. No. 98EX271), 1998, pp. 113-118.
Jri Lee, "A 20-GB/s Adaptive Equalizer in 0.13 um CMOS Technology" 2006 IEEE International Solid State Circuits Conference—Digest of Technical Papers, vol. 41, No. 9, Sep. 2006, 9 pages.

(Continued)

*Primary Examiner* — Young T. Tse

(57) ABSTRACT

Various embodiments relate to an adaptive linear driver, including: a continuous time linear equalizer (CTLE); a programmable transmit driver coupled with an output of the CTLE, wherein the transmit driver includes a first control port configured to receive a first control signal configured to adjust the output level of the programmable transmit driver; an output comparator coupled to an output of the programmable transmit driver, wherein the output comparator is configured to compare the output of the programmable transmit driver with a reference signal and to produce a first comparison signal; and a controller coupled to the output comparator and the first control port, wherein the controller produces a first control signal based upon the first comparison signal.

20 Claims, 4 Drawing Sheets

(56) References Cited

OTHER PUBLICATIONS

Liu et al.: "A 5-GB/s Serial-Link Redriver With Adaptive Equalizer and Transmitter Swing Enhancement" IEEE Transactions on Circuits and Systems I: Regular Papers (vol. 61 , Issue: 4 , Apr. 2014) pp. 1001-1011.

* cited by examiner

ADAPTIVE LINEAR DRIVERS

TECHNICAL FIELD

Various exemplary embodiments disclosed herein relate generally to automatic linearity control for adaptive linear drivers.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a adaptive linear driver, including: a continuous time linear equalizer (CTLE); a programmable transmit driver coupled with an output of the CTLE, wherein the transmit driver includes a first control port configured to receive a first control signal configured to adjust the output level of the programmable transmit driver; an output comparator coupled to an output of the programmable transmit driver, wherein the output comparator is configured to compare the output of the programmable transmit driver with a reference signal and to produce a first comparison signal; and a controller coupled to the output comparator and the first control port, wherein the controller produces a first control signal based upon the first comparison signal.

Various embodiments are described, wherein the output comparator is a power comparator that includes a low pass filter coupled to a rectifier and an output of the rectifier is coupled with a comparator.

Various embodiments are described, wherein comparator is configured to compare a voltage at the output of the rectifier with a reference voltage.

Various embodiments are described, wherein the reference voltage is variable depending on a type of signal received by the adaptive linear driver.

Various embodiments are described, wherein the bandwidth of the low pass filter is variable depending on a type of signal received by the adaptive linear driver.

Various embodiments are described, wherein the output comparator is one of a signal to noise ratio, an eye height comparator, or an eye width comparator.

Various embodiments are described, wherein the controller includes an up-down counter configured to increment or decrement based upon the comparison signal.

Various embodiments are described, wherein the controller includes a lookup table including control values based upon the value of the up-down counter and wherein the first control signal is based upon the value of the up-down counter and a corresponding value in the lookup table.

Various embodiments are described, wherein the up-down counter is a successive approximation register (SAR).

Various embodiments are described, further comprising a programmable gain amplifier (PGA) coupled between the output of the CTLE and the input of the programmable transmit driver, wherein the PGA includes a second control port.

Various embodiments are described, wherein the controller is coupled to the second control port, wherein the controller produces a second control signal based upon the first comparison signal.

Various embodiments are described, wherein the CTLE includes a third control port, the output comparator is configured to produce a second comparison signal based on the output of the programmable line driver, and the controller is coupled to the third control port, wherein the controller produces a third control signal based upon the second comparison signal.

Various embodiments are described, wherein the output comparator is a power comparator that includes a low pass filter coupled to a first rectifier and an output of the first rectifier is coupled with a comparator, and a high pass filter coupled to a second rectifier and an output of the second rectifier is coupled with the comparator.

Various embodiments are described, wherein the third comparison signal is based on a comparison between the output of the first rectifier and the second rectifier.

Various embodiments are described, wherein the power compactor includes a switch circuit with inputs connected to the reference voltage and the output of the second rectifier.

Various embodiments are described, wherein the reference voltage is variable depending on a type of signal received by the adaptive linear driver.

Various embodiments are described, wherein the bandwidth of the low pass filter and the high pass filter are variable depending on a type of signal received by the adaptive linear driver.

Various embodiments are described, wherein the controller is configured to sequentially produce the first control signal, the second control signal, and third control signal to control the programmable linear driver, PGA, and CTLE respectively.

Various embodiments are described, wherein the controller is configured to control the programmable linear driver, PGA, and CTLE during a training period of the adaptive linear driver.

Various embodiments are described, wherein the controller is configured to control the programmable linear driver, PGA, and CTLE during a communication period of the adaptive linear driver.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
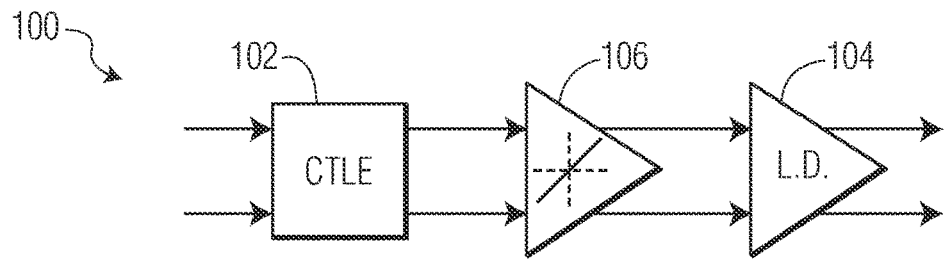
FIG. 1 illustrates a typical architecture of a linear redriver 100 in accordance with the prior art.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

PCB traces have high-frequency losses due to skin effect and dielectric losses which result in inter symbol interference (ISI), as the signal passes through cables and PCB traces. Embodiments of a digitally controlled loop to adjust linearity in a linear redriver will be described herein. The timing and applying the right code to adjust current in the redriver is being controlled digitally. It may be programmed easily based on system requirements and may be applied at start up (in a training sequence) or periodically during the communication depending on the system requirements. The required linearity level will be programmable for different standards (e.g., DPxx, USB3xx, USB4xx, PClexx)/modulations (e.g., PAM2, PAM3, PAM4, . . . ) The control loop may include that may be an "up/down counter", a successive approximation register (SAR) logic or a digital state machine. The same digital control circuit may be used to control a programmable gain amplifier (PGA) gain and shape an automatic gain control (AGC), by using a low pass path (LPF) of the control loop. Also by adding a high-pass filter in a power comparator, in combination with a programmable continuous time linear equalizer (CTLE) to shape, an active equalization (AEQ) may be implemented. A combined loop will also be described which will provide AEQ, AGC, and ALC functions and will lower the complexity and provides all the needed integrated tuning for advanced linear redrivers.

Depending on the system requirements, a linearity level will be set. It depends on the required linear signal level for the system which is connected to the linear redriver. The selected linearity level (e.g., 0.5V, 0.75V, . . . ) will change over process, voltage, and temperature (PVT). Trimming for process may compensate for part of the process variation, but variation over VT after trimming can be more than the required amount. It will directly impact the eye diagram height and width. At Gb/s data rates, the skin effect and dielectric loss of the channel cause frequency-dependent loss, thus resulting in intersymbol interference (ISI).

Various techniques have been developed to compensate for the signal loss along the transmission path, including receiver equalization and transmitter de-emphasis. To further extend the transmission path's reach at speeds as high as multi-Gb/s, a redriver is normally used to equalize and reshape the distorted signals so that the following host or device can recover the data without failing bite error rate (BER) specifications. A digitally controlled loop that adjusts the linearity during the training period or if done smoothly during the communication mode will keep the linearity within the desired range that results in a reliable predicted eye diagram that guarantees redriver performance in the employed system. Keeping linearity variation within a limited range may be done with trimming, but because trimming is being done for nominal conditions, any voltage or temperature variation will increase the linearity variation range. One solution is to keep the implemented linearity range "way" higher than the required range, but this will be expensive due to extra needed current since much higher than needed swing should be supported.

A scheme that tunes linearity and keeps it within the expected variation for various system applications is needed for higher data rate applications which use more advanced modulation schemes, such as PAM4. For example, no-return to zero (NRZ) (or PAM2) modulation does not need high linearity with small variation over PVT, but applications requiring higher data rates and more advanced modulations like PAM3 or PAM4 will need well controlled linearity.

If no training period is available, the equalization may be periodically carried out at the beginning of or during the communication. This approach (ALC) may be combined with an AEQ and AGC control loop for less complexity/area saving.

Also, a gain stage, either continuous in the form of a variable gain amplifier (VGA) or programmable in the form of PGA may be needed in a serial link, SerDes, or redriver. The control loop may also be used to adjust a PGA to implement AGC. A loop that can do all the needed equalization, gain adjustment, and linearity control saves area with lower risk and complexity with digital controlled.

FIG. 1 illustrates a typical architecture of a linear redriver 100 in accordance with the prior art. The linear redriver 100 includes a continuous-time linear equalizer (CTLE) 102 to equalize input signals and a linear transmitter (TX) line driver 104 to retransmit the signals based on signal standard specifications. A gain stage 106 may be needed between the CTLE 102 and the TX line driver 104. The gain stage 106 may be a PGA with fixed gain steps or an automatic gain control (AGC) stage. Depending on the design, the programmable/automatic gain stage may be present or be eliminated.

A linear redriver, as its name states, passes the signal linearly and does not make a decision about its level (or levels). It compensates for ISI loss, and with minimum added jitter, passes the equalized signal to the next device for further processing. The linear nature of linear redrived needs good linearity. Higher linearity comes with cost of higher power consumption, which preferably is to be avoided, but a predictable linearity with limited variation.

Figure 2A:
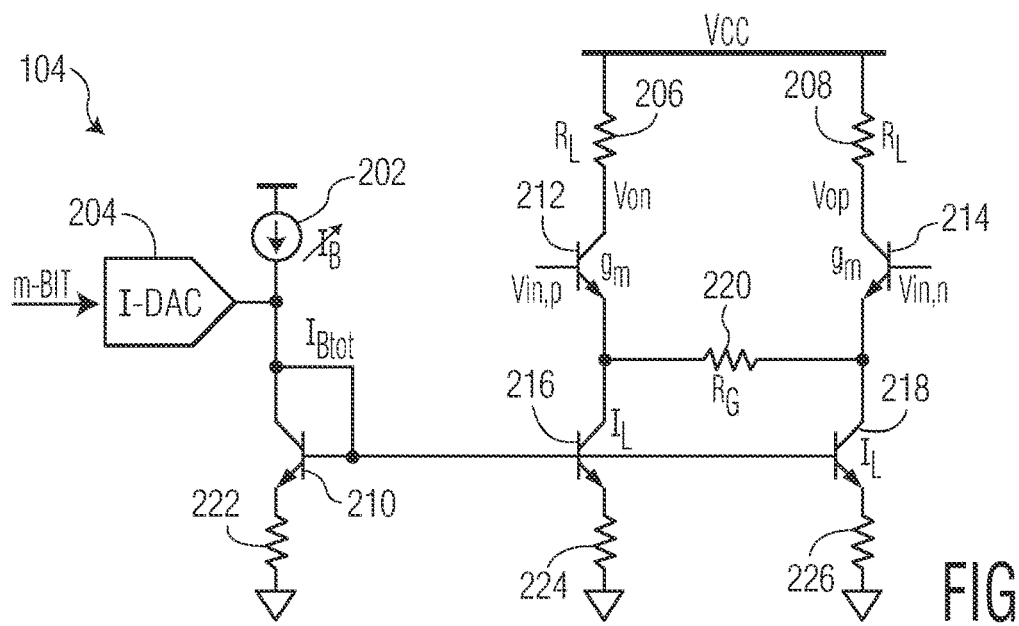
FIGS. 2A and 2B illustrate a generic implementation of the TX driver using bipolar transistors and MOS transistors respectively.
Figure 2B:
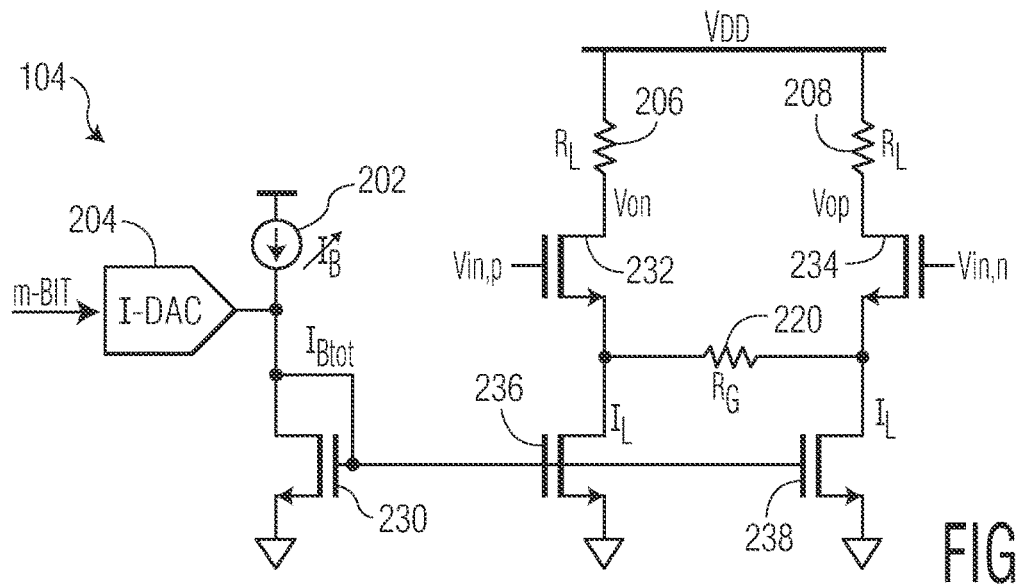

FIGS. 2A and 2B illustrate a generic CML (current mode logic) based implementation of the TX driver (with degeneration) using bipolar transistors and MOS transistors respectively. The TX driver 104 includes a current source 202 producing current $I_B$. An I-DAC (digitally controlled current source) receives an m-bit input and outputs a current based upon the input value that is combined with $I_B$ to produce $I_{Btot}$. This current may be controlled to adjust the linearity of the TX driver 104. The current $I_{Btot}$ then flows through transistor 210 or 230. The transistor 210 or 230 is connected to a current mirror. The current mirror is made up of transistors 212, 214, 216, and 218 or 232, 234, 236, and 238, and resistors 206, 208, 220. Resistors 222, 224, and 226 are also used in the TX driver 104 of FIG. 2A. The differential inputs are connected to transistors 212 or 232 and 214 or 234.

Linearity is often defined by using the swing of the signal, i.e., the variation between the highest and lowest value of the signal. When a device is linear, a plot of the input versus output will ideally appear as a line. To have a fully differential peak-to-peak swing of 1V with $R_L=50\Omega$, a current of 10 mA per branch of the current mirror (as in FIG. 2A or 2B) may be needed (with some margin). A higher linearity needs more current which is not a desired situation. Some systems can work with lower swing levels for which less linearity is needed. The value of linearity is one parameter, but its variation over PVT is more important due to the direct impact on signal characteristic which will impact eye height and width in the eye diagram.

To have more predictable and reliable performance, variation of linearity should be limited to a value which system requires. This variation limit can be pretty tight in some applications (e.g., in PAM4 signaling).

Injecting more current into the TX driver means higher swing if overall design headroom allows. For a selected linearity setting, the current $I_B$ is fixed. However, PVT variation causes variation of the effective 1dB compression point. The illustrated I-DAC 204 with "m-bit" control can be used for trimming purpose to compensate for process variation of the overall current. However voltage and temperature variation cannot be compensated by trimming. A real time scheme that adjusts the I-DAC would be more effective. Also, current trimming will adjust the voltage headroom only. Linearity has a deeper concept, as the $g_m$ (transconductance) of the transistors impacts the linearity as well (because the overall differential pair does need to work in its linear region).

The gain of TX driver 104 with degeneration resistor, $R_G$, can be simplified as $G_{m,eff}=g_m/(1+g_m R_G) \sim 1/R_G$ and its gain will be proportional to $G_{m,eff} \ast R_L \sim R_L/R_G$. The fine adjustment will happen by changing $I_L$ of the differential pair (the bipolar transistor case is easier due to linear behavior of $g_m$ versus I, but both schemes follow the same concept).

As is illustrated in FIGS. 2A and 2B, the main current source bias 202 that may be programmed for different linearity levels (e.g., 500 mV, 750 mV, 900 mV, . . . ) to provide coarse programming for the linearity. Further, the TX driver 104 includes the I-DAC 204 that provides a programmable feature to fine tune the DC level at the TX driver output which practically provides more headroom to have a better linearity. $I_{Btot}=I_B+I_{DAC}$ is the current mirror current that TX diver will use.

The fine tuning, in the form of trimming, may be done on the automated test equipment during factory test and the chosen bit may be saved in the available memory of the chip. However this trimming compensates only for process and only for a nominal condition, and the voltage and temperature variation, which may be up to +/−20%, will be additional variations that should be compensated. That means that an on-chip tuning for linearity is needed to control linearity within the required range.

In order to compensate for variations in output swing, a comparator with a threshold may be used to compare the output signal to the threshold. This works fine for lower frequency signals, but when the signals are in the GHz or greater rate it becomes very difficult to determine swing using a comparator. It is noted that the integrated power of the output signal may be used to determine swing variation. In order to understand swing variation versus integrated power, a simulation of the redriver 100 illustrated in FIG. 1 was carried out using a 50Ω output termination. The following parameters were used in the simulation:

Input signal is 0.9V 32 Gbps PRBS7, with 20 dB SNR;
A channel loss of 20 dB at Nyquist frequency of 16 GHz;
CTLE peaking gain is set at 20 dB to have a fairly smooth equalization;
Linearity value is set to different values (as part of TX driver to simplify the model); and
PAM2, PAM3 and PAM4 modulations were simulated.

Figure 3:
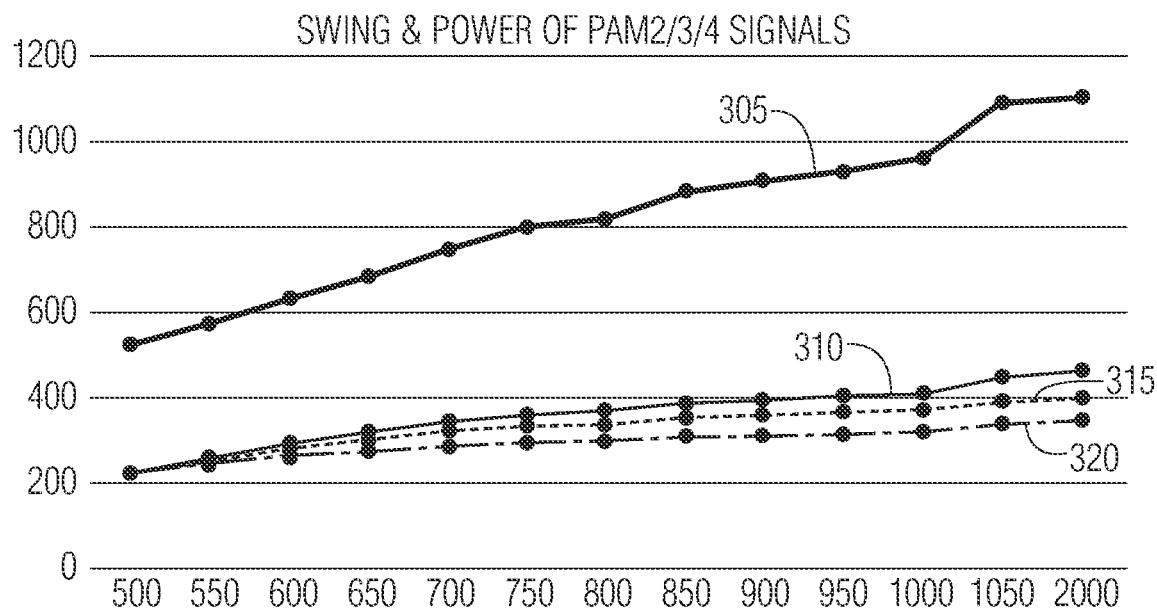
FIG. 3 illustrates plots of the output swing and the scaled accumulated power of the PAM2, PAM3 and PAM4 signals versus output 1 dB compression point of the redriver.

As discussed above the 1 dB compression point may be used as a measure of linearity that may then be used to help compensate for voltage and temperature based variations in linearity of the redriver. FIG. 3 illustrates plots of the swing and the scaled integrated power of the PAM2/3/4 signals at output of the nonlinear redriver versus input signal swing. The plot 305 is a plot of output swing of the redriver versus the 1 dB compression point of the redriver. As is seen, the maximum swing will be close to the input signal level (until 1 dB compression point of the redriver), and the difference is due to the fact that the equalization is not perfectly matched to the channel loss. Plots 310, 315, and 320 illustrate the output integrated power versus 1 dB compression point. These plots show how the different modulation schemes have different integrated power for the same linearity (although output swing is almost the same for different modulation schemes). Further, the simulation generated information regarding the eye height ($E_H$) of the eye diagram for each of the modulation schemes as illustrated in Table 1 below.

TABLE 1

| 1 dB Comp. Point. | Output Swing | PAM2 | | PAM3 | | PAM4 | |
| --- | --- | --- | --- | --- | --- | --- | --- |
| | | Power | EH | Power | EH | Power | EH |
| 650 | 684 | 318 | 463 | 302 | 110 | 272 | 19 |
| 700 | 750 | 340 | 478 | 317 | 111 | 284 | 19 |
| 750 | 800 | 358 | 478 | 331 | 111 | 292 | 19 |
| 800 | 825 | 372 | 478 | 342 | 116 | 300 | 24 |
| 850 | 885 | 384 | 478 | 350 | 116 | 306 | 24 |
| 900 | 911 | 395 | 478 | 358 | 121 | 312 | 24 |

Some simple and efficient conclusions from the simulated data can be listed as follows:

PAM2: The best EH occurs when P~340-358 which is equal to 1 dB comp. point of 700-750 mV. Greater linearity than that is not needed because it costs extra current.

PAM3: The best $E_H$ occurs when P~342-350 which is equal to 1 dB comp point of 800-850 mV. This means that the "threshold level to get PAM2 and PAM3 is the same, but the selected 1 dB comp point will be different (PAM2: of 700-750 mV , PAM3: 800-850 mV). This is in line with the power ratio of PAM2/PA3 signal which is ~1.08-1.09 for the optimum $E_H$ case. This is fairly equal to 372/342~1.0877. This means that the Threshold point for PAM3 case needs to be selected higher with the same ratio.

PAM4: The middle $E_H$ of PAM4 will not be impacted by lower linearity. Top and bottom $E_H$ will be impacted, so that is chosen for simple analysis. As is seen in Table 1, the $E_H$ of 24 mV is the best can be achieved for the considered channel loss/SNR and selected equalization. A power of 300-360 provides the best achievable $E_H$. It is equal to minimum 1 dB comp point of 800-850 mV. More than this provides the same $E_H$ since noise/loss/equalization profile limits it. The power ratio of PAM4/PAM3 is ~1.13-1.14, fairly close to 342/306~1.117. This means that the Threshold point for PAM4 case needs to be selected higher with the same ratio.

These results may be summarized as follows and leads to the following observations: the threshold for the optimum $E_H$ (due to linearity) should be adjusted for PAM2/PAM3 and PAM4 modulation; and the accumulated power in a power detector should be compared to a selected threshold (from look up table) to achieve the needed higher linearity.

As described in FIG. 2, the TX driver has a programmable feature to fine tune the DC level at the TX output which allows for increased headroom to have better linearity. As was described above, depending on the SNR of the incoming signal and channel loss and applied equalization of the linear redriver, the EH of the output reaches to its maximum value with a certain 1 dB compression point (linearity) and increasing linearity above that brings no value except consuming more current which is undesirable. Output EH is related to signal power, so a power comparator or other circuits which accumulate signal power and use a comparator will indirectly judge the output linearity level. Also a scheme which can judge $E_H$ can be used instead of power comparator (due to Table 1, $E_H$ of an equalized signal has direct relation with linearity).

Figure 4:
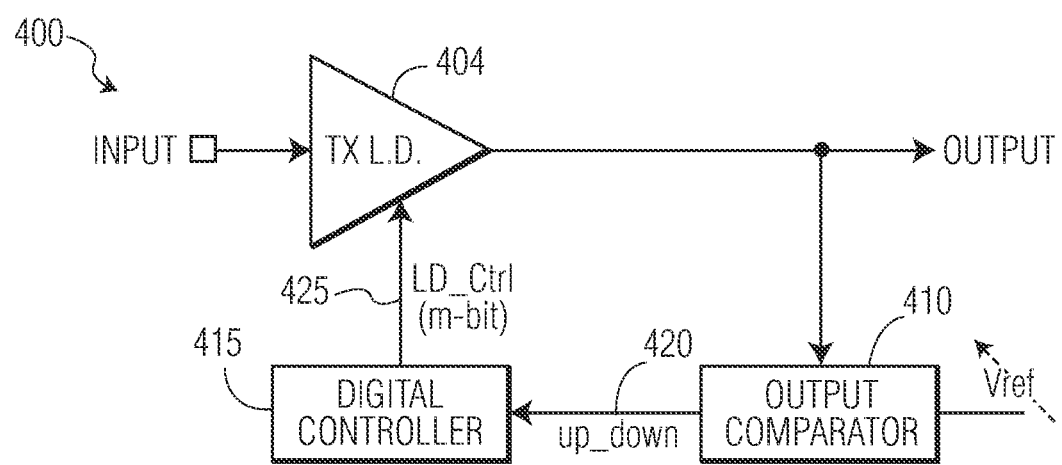
FIG. 4 illustrates a TX driver with a control loop that compensates for linearity.

FIG. 4 illustrates a TX driver with a control loop that compensates for linearity. The TX driver 404 includes a fine control of the DC level at its output. This may be accomplished as illustrated in FIGS. 2A and 2B using an I-DAC 204 to fine tune the drive current. The control loop includes the output comparator 410 and controller 415. The output comparator receives a threshold value that is compared to a measure of the output of the TX driver 404. The output comparator provides a comparison signal 420 to a controller 415. The controller 415 outputs a control signal LD_Ctrl 425 to the TX driver 404 based upon the comparison signal 420. For example, the control signal LD_Ctrl 425 may be an m-bit signal used to control the I-DAC in the TX driver 404.

Figure 5:
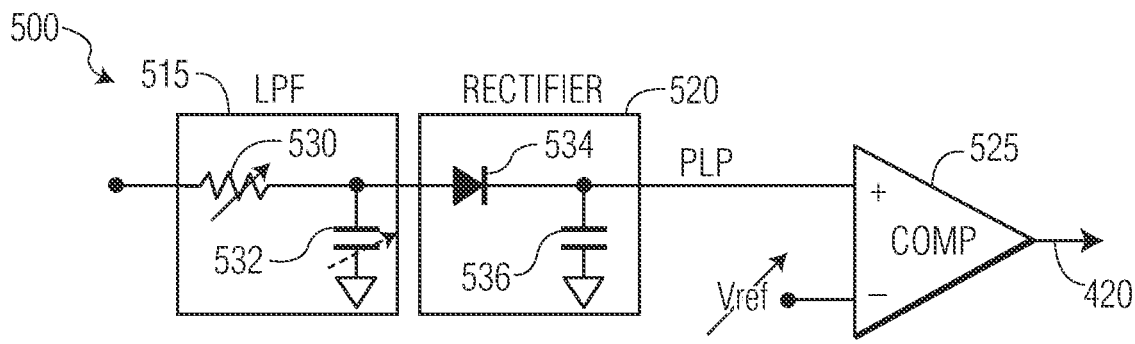
FIG. 5 illustrates an integrated power comparator.

FIG. 5 illustrates a conceptual integrated power comparator. The power comparator 500 may function as the output comparator 410 in FIG. 4. The power comparator 500 may include a lowpass filter 515, a rectifier 520, and a comparator 525. The lowpass filter 515 filter filters out high frequency components of the output of the TX driver 404. The bandwidth of the low pass filter 515 will be slightly higher than the bandwidth of the signal to be compared. The lowpass filter is shown as having a variable resistor 530 and a variable capacitor 532 that form a lowpass filter with a bandwidth that can be adjusted using the variable resistor 530 and the variable capacitor 532. Adjustment of bandwidth provides flexibility to cover different data rates as needed. Accordingly, the bandwidth of the low pass filter 515 may be adjusted based upon the mode or application of the redriver. Other lowpass filter architectures may also be used. The output of the lowpass filter 515 is then rectified using a rectifier 520. The rectifier may include a diode 534 and a capacitor 536. Other rectifier architectures may be used as well. The output PLP of the lowpass filter 515 and the rectifier 520 is indicative of the integrated power of the output signal from the TX driver 404. The comparator 525 then compares the output of the rectifier 520 with the voltage reference $V_{ref}$. The voltage reference $V_{ref}$ may be selected based upon the modulation scheme of the input signal. The output of the comparator 525 will provide a comparison signal 420 indicative of variation in the swing of the output of the TX driver 404 that then may be used by the controller 415 to control the I-DAC 204 in the TX driver 404.

In other embodiments of the output comparator 410, the eye height or eye width of the output from the TX driver 404 may be determined and compared to threshold values. This may be done, directly or indirectly, as eye height and eye width may be indicative of changes in the 1 dB compression point of the system. In other embodiments of the output comparator 410, the signal to noise ratio of the output from the TX driver 404 may be determined and compared to threshold values. Other signal characteristics may also be used by the output comparator 410.

Figure 6A:
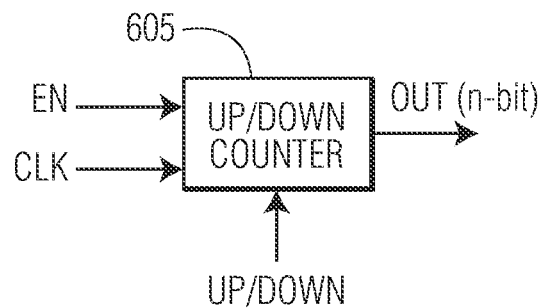
FIG. 6A illustrates an up/down counter that may be used as a controller.
Figure 6B:
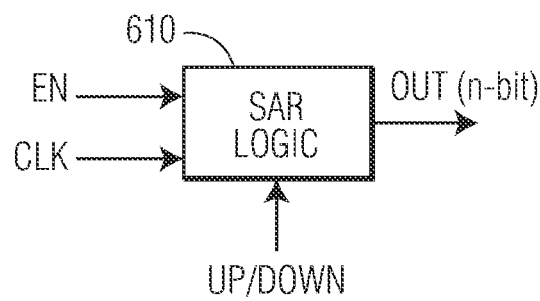
FIG. 6B illustrates a SAR based logic which may be used in the controller.

The controller 415 may be a digital controller. FIG. 6A illustrates an up/down counter 605 that may be used as a controller 415. The up/down counter 605 increments when the output of the output comparator 410 is high and decrements when the output of the output comparator 410 goes low. The controller 415 may also include a lookup table that includes control values based upon the value of the up/down counter 605. FIG. 6B illustrates a SAR based up-down logic 610 which may be used in the controller 415 and that operates similarly to up/down counter 605.

FIG. 4 illustrates the scheme which will control the linearity. It is assumed that signal before the TX driver was in its linear range and that the linearity level of the TX driver is adjustable. The voltage $V_{ref}$ indicates a programmable threshold voltage to select different 1 dB compression levels for different types of modulations. As the swing of the output of the TX driver 404 varies, the controller 415 will adjust the current generated by the I-DAC 204 to adjust the output of the TX driver 404 to the desired output swing.

Figure 7:
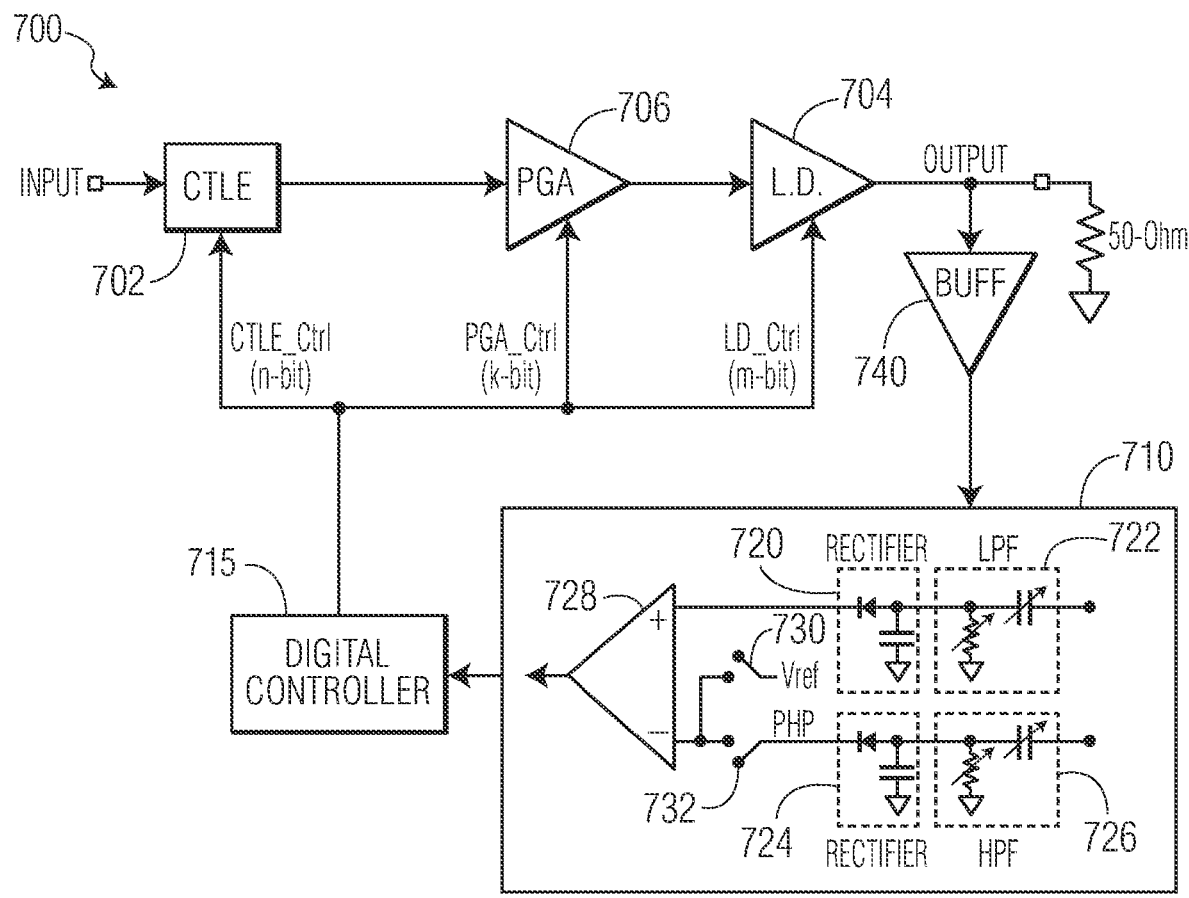
FIG. 7 illustrates another embodiment of a control scheme for the linear redriver.

FIG. 7 illustrates another embodiment of a control scheme for the linear redriver. The linear redriver 700 of FIG. 7 is similar to the linear redriver 400 of FIG. 4 with a few changes. The redriver 700 includes CTLE 702, PGA 706, TX driver 704, buffer 740, output comparator 710, and digital controller 715. A buffer 740 is included to receive inputs from the TX driver 704. The output of the buffer 740 drives the output comparator 710 that is included in the linear redriver 700. The input resistance of the buffer 740 is high enough such that the buffer 740 does not affect the output resistance of the TX driver 704.

The output comparator 710 includes a low pass filter 722 and rectifier 720 that operate like those in FIG. 5 and that produce a comparison signal PLP. The high pass filter 726 filters the TX driver output signal and the rectifier 724 rectifies the high pass filtered signal to produce a comparison signal PHP. PHP is indicative of the integrated power of the high frequency portion of the TX driver output signal. The output comparator 710 includes a switch circuit including switches 730 and 732 that determine what signal is compared to PLP. The switches 730 and 732 select either the reference voltage $V_{ref}$ or PHP which is then input into the comparator 728. In another embodiment, the switch circuit may include only one switch that connects either the reference voltage $V_{ref}$ or PHP to an input of the comparator 728. A comparison between PLP and $V_{ref}$ is used to produce a first comparison signal to control the TX driver 704 as described above. It further may be used to control the PGA 706 to thus provide an AGC function.

The comparison of PLP to PHP may be used to produce a second comparison signal to control the CTLE 702. The low frequency and high frequency classification can be arbitrary in some embodiments and the low pass and high pass filters 722 and 726 may be adjusted according to the arbitrary low frequency and high frequency ranges. At Gb/s data rates, the skin effect and dielectric loss of the channel cause frequency-dependent loss, thus resulting in inter-symbol interference (ISI). Various techniques have been developed to compensate for the signal loss along the transmission, including receiver equalization and transmitter de-emphasis. To further extend the transmission's reach at speeds as high as multi-Gb/s, the redriver is normally used to equalize and reshape the distorted signals so that the following host or device can recover the data without failing bit error rate (BER) specification. CTLEs are employed at the receive front end to compensate the channel loss and provide an equalized low-jitter output data. Implementing an equalizer with fixed peaking gain setting will result in non-optimum ISI at receiver input. Therefore, the control loop helps to automatically detect and compensate the channel loss that is preferred for some applications. Typical adaptive CTLEs are controlled in continuous form and are controlled continuously during the communication. Embodiments of the adaptive CTLE 702 described here, adjust the CTLE 702 during the training period to avoid the extra tuning current consumption and avoids any injected noise that may cause BER failure during communication. If no training period is available, the CTLE 702 may do the equalization periodically at the beginning or during the communication. The CTLE 702 described here uses a control loop to optimize both equalization and gain, thus provides a better efficiency and space saving on a chip. The Digital controller 715 may receive the second comparison signal to produce a n-bit control signal CTLE_Ctrl. CTLE_Ctrl controls the settings of the CTLE to result in better equalization of the input signal. The controller 715 may use an up/down counter as described above in order to generate CTLE_Ctrl.

The Digital controller 715 may be an up/down counter as in controller 415. The controller may produce an m-bit control signal LD_Ctrl based upon the first comparison signal that functions the same as the control signal 425 in FIG. 4. Further, the controller may use the first comparison signal to produce a k-bit control signal PGA_Ctrl that is used to adjust the programmable gain of the PGA 706.

As a result, the linear redriver 700 provides a feedback control loop that controls the CTLE 702, PGA 706, and TX driver 704. This allows for compensating for voltage and temperature effects that cause the linearity performance of the linear redriver 700 to vary. It can even be used for process compensation purpose too in a coarse tuning/adjustment scheme.

The linearity adjustments of the redriver 700 may be done sequentially. For example, first, the linearity of the CTLE 702 is adjusted. Then the linearity of the PGA 706 next may be adjusted, followed by the TX driver 704. This sequence may be done in other orders as well and may be controlled by the controller 715. Sequence of adjustment may be different for different architectures.

Note that the selected resolution of the various control signals depends on technology and required steps in the system that it is being used. Also, note that the automatic scheme may be bypassed and digital control codes may be applied through, for example, an I2C bus.

Embodiments of a redriver are described herein that provide a scheme to tune the linearity of a the linear driver or redriver. This tuning may adjust linearity over temperature, voltage (and process). The embodiments described are simple and efficient. An adjustable threshold level is used to comply with different communication and modulation standards, and the embodiments are compatible with different modulation schemes, such as for example, PAM2, PAM3, PAM4, etc. The embodiments described are easily implemented in mixed-mode chips where the digital part of the control loop may be integrated in digital section of the chip. The control scheme may be applied whenever chip starts up or periodically depending on the system requirements. The redriver embodiments may be easily programmed according to the frequency, modulation, and nature of incoming signal for different standards (e.g., USBxx, DPxx, TBT, USB4, PCIeXX, etc.) Also the redriver embodiments may be used at a beginning of the data sequence, in a training period, or during a communication period, one time or periodically depends on the system requirements.

Further, the redriver embodiments avoid any RX channel disturbance which may lead to worse BER if used during the training sequence. The embodiments may also adjust the bandwidth of filters in the loop and/or a comparator reference voltage to comply with different standards (USBxx, DPxx, TBT, USB4, PCIe5/6, etc.) The feedback control may be applied at the start of communication or during communication. Also, the same digitally controlled loop that compensates for swing variations may be used to provide an automatic gain control (AGC) by controlling a programmable gain stage, and may control signal equalization by controlling the CTLE to form an adaptive equalizer.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. An adaptive linear driver, comprising:
  a continuous time linear equalizer (CTLE);
  a programmable transmit driver coupled to an output of the CTLE, wherein the programmable transmit driver includes a first control port configured to receive a first control signal to adjust an output level of the programmable transmit driver;
  an output comparator coupled to an output of the programmable transmit driver, wherein the output comparator is configured to compare the output of the programmable transmit driver with a reference signal and to produce a first comparison signal; and
  a controller coupled to the output comparator and the first control port, wherein the controller produces the first control signal based upon the first comparison signal and provides the first control signal to the programmable transmit driver.

2. The adaptive linear driver of claim 1, wherein the output comparator is a power comparator that includes a low pass filter coupled to a rectifier and an output of the rectifier is coupled with a comparator.

3. The adaptive linear driver of claim 2, wherein the comparator is configured to compare a voltage at the output of the rectifier with a reference voltage.

4. The adaptive linear driver of claim 3, wherein the reference voltage is variable depending on a type of signal received by the adaptive linear driver.

5. The adaptive linear driver of claim 2, wherein the bandwidth of the low pass filter is variable depending on a type of signal received by the adaptive linear driver.

6. The adaptive linear driver of claim 1, wherein the output comparator is one of a signal to noise ratio comparator, an eye height comparator, or an eye width comparator.

7. The adaptive linear driver of claim 1, wherein the controller includes an up-down counter configured to increment or decrement based upon the first comparison signal.

8. The adaptive linear driver of claim 7, wherein the controller further includes a lookup table including control values based upon a value of the up-down counter and wherein the first control signal is based upon the value of the up-down counter and a corresponding value in the lookup table.

9. The adaptive linear driver of claim 7, wherein the up-down counter is a successive approximation register (SAR).

10. The adaptive linear driver of claim 1, further comprising a programmable gain amplifier (PGA) coupled between the output of the CTLE and an input of the programmable transmit driver, wherein the PGA includes a second control port.

11. The adaptive linear driver of claim 10, wherein the controller is coupled to the second control port, wherein the controller produces a second control signal based upon the first comparison signal and provides the second control signal to the PGA.

12. The adaptive linear driver of claim 11, wherein
the CTLE includes a third control port,
the output comparator is configured to produce a second comparison signal based on the output of the programmable transmit driver, and
the controller is coupled to the third control port, wherein the controller produces a third control signal based upon the second comparison signal and provides the third control signal to the CTLE.

13. The adaptive linear driver of claim 12, wherein
the output comparator is a power comparator that includes a low pass filter coupled to a first rectifier and an output of the first rectifier is coupled with a comparator, and
a high pass filter coupled to a second rectifier and an output of the second rectifier is coupled with the comparator.

14. The adaptive linear driver of claim 13, wherein
the output comparator is configured to produce a third comparison signal based on a comparison between the output of the first rectifier and the output of the second rectifier.

15. The adaptive linear driver of claim 14, wherein the power comparator further includes a switch circuit with inputs connected to a reference voltage and the output of the second rectifier.

16. The adaptive linear driver of claim 15, wherein the reference voltage is variable depending on a type of signal received by the adaptive linear driver.

17. The adaptive linear driver of claim 13, wherein the bandwidth of the low pass filter and the bandwidth of the high pass filter are variable depending on a type of signal received by the adaptive linear driver.

18. The adaptive linear driver of claim 12, wherein the controller is configured to sequentially produce the first control signal, the second control signal, and the third control signal to control the programmable transmit driver, the PGA, and the CTLE respectively.

19. The adaptive linear driver of claim 12, wherein the controller is configured to control the programmable transmit driver, the PGA, and the CTLE during a training period of the adaptive linear driver.

20. The adaptive linear driver of claim 12, wherein the controller is configured to control the programmable transmit driver, the PGA, and the CTLE during a communication period of the adaptive linear driver.

\* \* \* \* \*